United States Patent [19]

Rottinghaus

[11] Patent Number: 5,027,087
[45] Date of Patent: Jun. 25, 1991

[54] FAST-SWITCHING FREQUENCY SYNTHESIZER

[75] Inventor: Alan P. Rottinghaus, Schaumburg, Ill.

[73] Assignee: Motorola, Inc., Schaumburg, Ill.

[21] Appl. No.: 474,969

[22] Filed: Feb. 2, 1990

[51] Int. Cl.[5] .................... H03C 3/09; H03L 7/085; H03L 7/18
[52] U.S. Cl. .................................. 332/127; 331/10; 331/14; 331/16; 331/17; 331/25
[58] Field of Search ............... 331/1 A, 10, 14, 16, 331/17, 25; 332/127, 128

[56] References Cited

U.S. PATENT DOCUMENTS

| | | | |
|---|---|---|---|
| 4,105,948 | 8/1978 | Wolkstein | 331/14 |
| 4,410,860 | 10/1983 | Kipp et al. | 331/1 A |
| 4,511,858 | 4/1985 | Charavit et al. | 331/10 |
| 4,634,998 | 1/1987 | Crawford | 331/1 A |

Primary Examiner—Siegfried H. Grimm

[57] ABSTRACT

An improved fast-switching frequency synthesizer is disclosed. The fast-switching frequency synthesizer, according to the invention, utilizes presteering voltage injection at the voltage controlled oscillator ("VCO") with feedback to allow the VCO, and synthesizer, to quickly transition between two given frequencies. This presteering mechanism, with the feedback, allows the presteering voltage to track the variations in the VCO gain from device to device, and gain changes while in operation. This same information is used to implement a means of automatically adjusting the FM deviation of the transmitter since that information varies with the gain of the VCO as does the FM deviation.

98 Claims, 2 Drawing Sheets

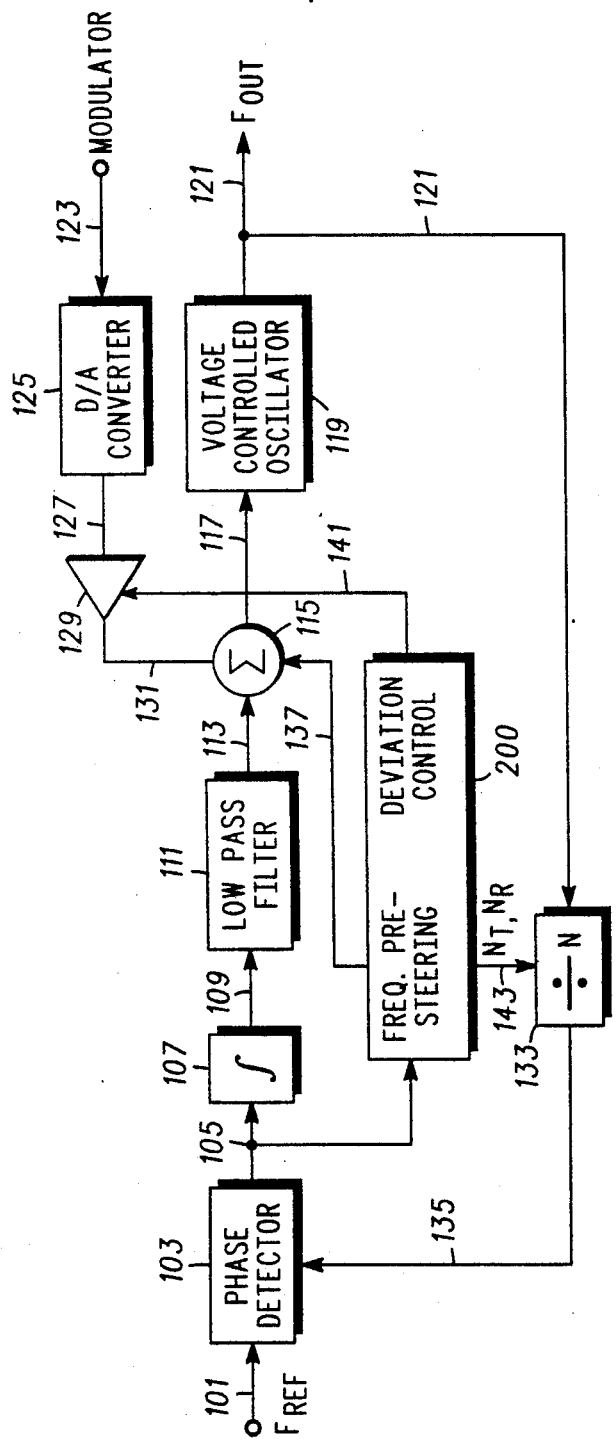
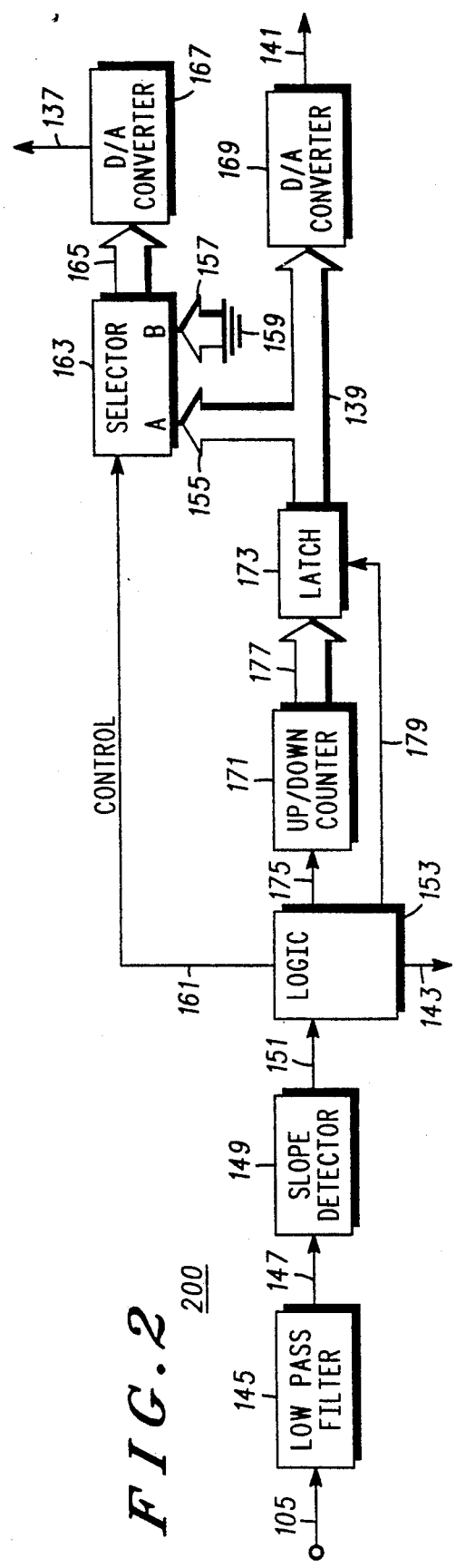

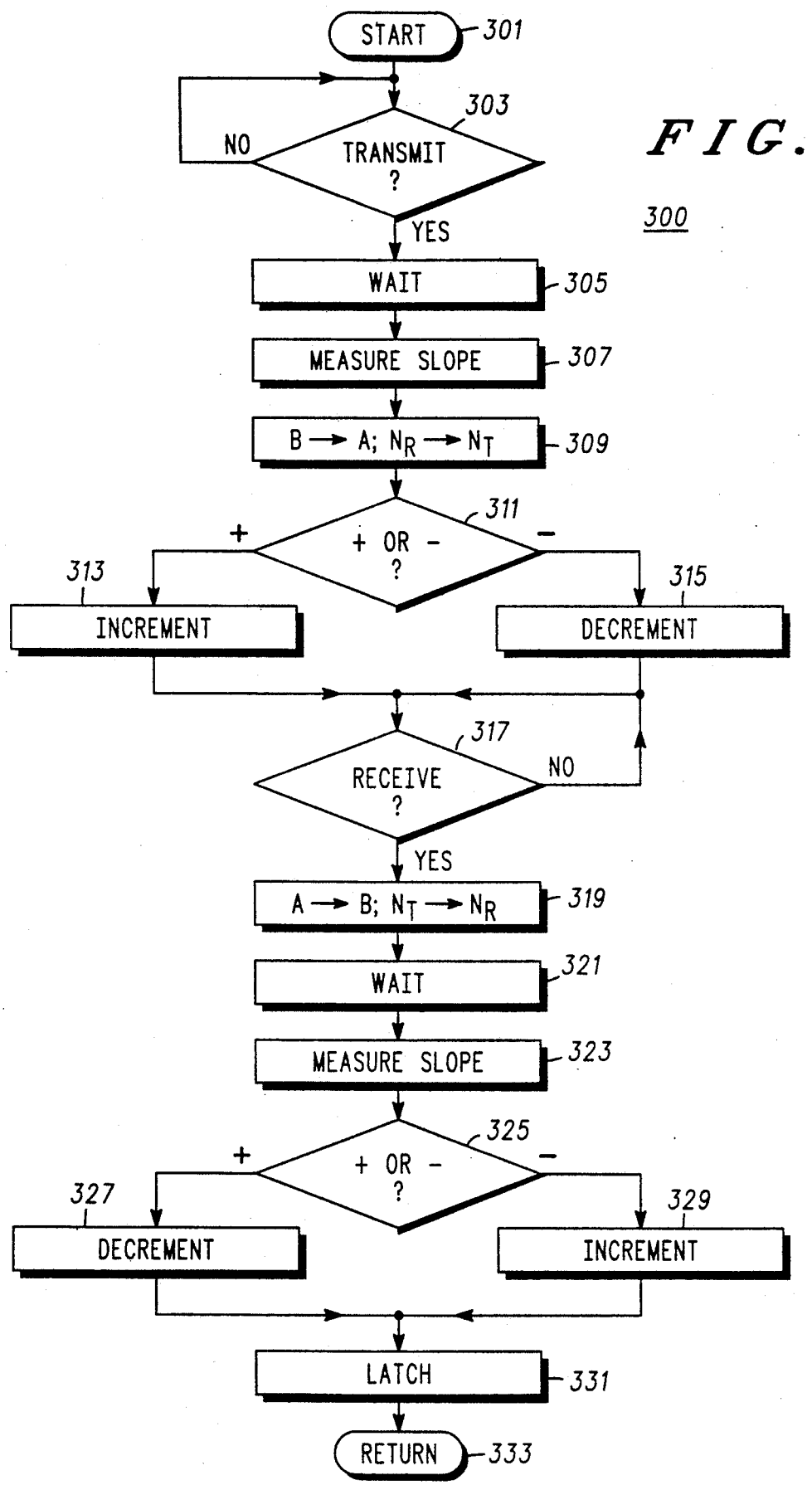

4,027,087

FAST-SWITCHING FREQUENCY SYNTHESIZER

TECHNICAL FIELD

This application relates to frequency synthesizers and more particularly to fast-switching frequency synthesizers.

BACKGROUND OF THE INVENTION

It is common to use a single frequency synthesizer in an FM radio to generate both the transmit frequency source and the receive local oscillator ("LO") for down-conversion. This type of synthesizer is typical in applications where a device receives and transmits on the same channel at different points in time. A significant problem in this type of application is getting the synthesizer to switch between the transmit frequency and the receive LO frequency as quickly as possible. The time the synthesizer takes getting between these two frequencies is literally wasted by the radio since it can neither transmit or receive during this time period.

Some past approaches to reducing this switching time have included, for example, parameter optimization and adaptive filtering. Each of these approaches, however, has limitations. A problem with parameter optimization has been that it requires modifying the closed-loop bandwidth. A problem with adaptive filtering has been transients and loop response optimization.

As a result, there is a need for an improved fast-switching frequency synthesizer.

SUMMARY OF THE INVENTION

Therefore, an improved fast-switching frequency synthesizer is provided. According to the invention, the synthesizer utilizes presteering voltage injection at the voltage controlled oscillator ("VCO") to cause the frequency to change rapidly. Also, feedback is added to the presteering network to maintain an accurate presteering voltage as the gain of the VCO varies from unit to unit or drifts with temperature and age. The improved fast-switching frequency synthesizer, according to the invention, also uses the presteering voltage value to control the transmitter deviation, thereby eliminating the need for manual alignment.

BRIEF DESCRIPTION OF THE DRAWINGS

FIG. 1 is a block diagram that shows a first embodiment of an improved fast-switching frequency synthesizer 100, according to the invention.

FIG. 2 shows the frequency pre-steering and deviaton control circuit 200 of the first embodiment.

FIG. 3 shows a flow diagram 300 for the first embodiment.

DETAILED DESCRIPTION OF THE INVENTION

FIG. 1 is a block diagram that shows a first embodiment of an improved fast-switching frequency synthesizer 100, according to the invention. As shown, the synthesizer is arranged with a frequency pre-steering and deviation control circuit 200. The synthesizer has two inputs—a reference frequency signal 101 ($f_{ref}$) and a digital baseband modulator signal 123.

As shown, the frequency reference signal 101 is input to the phase/frequency detector 103 where it is compared to the divided-down VCO output frequency 135. An output error signal 105 of the phase detector 103 is next applied to integrator 107. This integrator 107 is a typical integrator unit with a response in the S-plane of $(s+a)/Ks$.

The integrator output 109 is next applied to the low pass filter 111. This filter may be, for example, a typical 3-pole design with a bandwidth at least one order of magnitude greater than the natural frequency of the closed loop transfer function and at least one octave (preferably one decade) in frequency less than $f_{ref}$(101).

As shown, the digital baseband modulator signal 123 is input to the digital to analog (D/A) converter 125 to provide an analog baseband modulator signal 127. This signal is then level-adjusted by a variable gain device 129 to set the FM deviation. The gain of device 129 is adjusted by level control line 141.

Returning now to low pass filter 111, the filter's output 113 is summed with the analog baseband modulator signal 131 and signal 137 by the summing amplifier 115. The summing amplifier's output 117 is then input to the control line of the voltage controlled oscillator (VOC) 119. The output of the VCO 119 is the transmitter RF frequency output signal 121. This signal is divided down to a frequency 135 equal to the frequency of $f_{ref}$ 101 by the divider 133's divisor (N). As shown, N is controlled by lead 143, and alternates between two values—$N_t$ corresponding to the transmit frequency and $N_r$ corresponding to the receive LO frequency.

As shown, the frequency presteering and deviation control circuit 200 switches the synthesizer 100 between the transmit frequency and the receive local oscillator (LO) frequency by changing the value of N via lead 143. As will be seen below, the circuit 200 also encourages the synthesizer's fast transition between states by simultaneously appylying a voltage step signal of optimum amplitude to the VCO 119 via lead 137.

When the synthesizer goes to the transmit state, the frequency presteering and deviation control circuit 200 changes 143 from $N_r$ to $N_t$ simultaneously while injecting a positive-going voltage step signal at lead 137 to cause a corresponding change in voltage at the VCO input 117. As will be seen, the amplitude of this step signal has been determined to be the optimum value to change the VCO frequency from receive LO to transmit frequency. As a result, frequency changes at lead 135 are minimized and thus the error voltage 105 remains generally constant.

When the synthesizer goes to the receive state, the frequency presteering and deviation control circuit 200 changes signal 143 from $N_t$ to $N_r$ simultaneously as it changes the voltage at 137 from the above positive value back to zero. This negative-going voltage step at 137 causes a negative-going step at 117. As above, this voltage is substantially the voltage needed to change the VCO frequency from transmit frequency to receive LO frequency.

One problem with this pre-steering voltage arrangement is that the optimum value of step voltage change at the VCO input 117 to cause the frequency transition varies with temperature changes and unit variations. This is primarily due to variatons in the voltage-versus-frequency characteristic of the VCO.

To solve this problem, the phase detector output signal 105 is used as an input to the frequency presteering and deviation control circuit 200 to provide feedback to keep the amplitude of the voltage step at lead 117 as close to the optimum value as possible. This is explained below.

Ideally, the phase detector 103's output signal 105 should be constant with zero slope at all times. According to the invention, circuit 200 incrementally increases or decreases the size of the voltages step 137 based on the slope of signal 105. This process is repeated each time the synthesizer switches from the transmit to the receive state. This adjustment continues until the slope of signal 105 is substantially zero and the step voltage 137 reaches its optimum value.

Moreover, the inventor has discovered the voltage step on signal 137 also gives a relative indication as to the slope variation in the VCO frequency-versus-voltage curve. Since the deviation of the FM transmitter also depends on the slope of this VCO curve, this indication may be used to adjust the relative FM deviation corresponding to that curve. According to the invention, the frequency presteering and deviation control circuit 200 uses level control signal 141 to control the variable gain device 129 in the baseband modulator path. Thus, when circuit 200 determines that the gain of the VCO has increased (or decreased), it decreases (or increases) the gain of device 129 via signal 141 to maintain a constant FM deviation.

Referring now to FIG. 2, there is shown the frequency pre-steering and control circuit 200. As shown, signal 105 is applied to a low pass filter 145. Filter 145 should have a bandwidth of at least twice that of the closed loop natural frequency of the synthesizer loop. The filter's output 147 is applied to slope detector 149. Slope detector 149 may be implemented, for example, by an A/D converter that samples two points in time and then compares them. Alternatively, detector 149 may be implemented by a comparator having signal 147 as a first input and a band-limited version of signal 147 as a second input. As shown, slope detector 149's output (151) is coupled to logic circuit 153.

As depicted, the logic circuit 153 receives the slope measurement information via signal 151.

The logic circuit 153 has four outputs—the divisor output signal 143, a selector control path 161, a latch control path 179, and an up/down counter control path 175.

The up/down counter output 177 is periodically transmitted to latch 173 under control of path 179. As will be seen, the latch output bus 139 is used to generate both the level control signal 141 and the step voltage signal 137. The number of outputs bits in the up/down counter 171 should at least be the same as the number of bits on the latch output bus 139. Alternatively, the up/down counter 171 may have more bits than the bus 139 if the additional bits of the counter 171 are below the least significant bit of the bus 139. This configuration would effectively create a time constant in the counter 171 so that it would take more than one increment (or decrement) in a row to toggle the least significant bit of the bus 139. The process of incrementing, decrementintg, and latching the up/down counter 171 will be discussed below.

As shown, the level control siganl 141 is generated by applying the latch output bus 139 to the input of digital to analog converter 169. The output of converter 169 is the level control signal 141.

As shown, the step voltage signal 137 is generated by alternately switching selelctor 163 between it's "A" input 155 and it's "B" input 157. Latch output bus 139 is applied to the A input 155, while all zeroes—represented by the ground signal 159—is applied to the B input 157. The logic circuit 153 selectively toggles the selector 163 between A and B inputs via control lead 161. The selector output 165 is applied to the input of digital to analog converter 167. The output of converter 167 is the step voltage signal 137.

FIG. 3 shows a flow diagram executed by the logic circuit 153. The process starts at step 301, and then goes to step 303. Here the process waits for a request for the synthesizer to go to the transmit state. When the synthesizer is ready to go to the transmit state, the process goes to step 305.

In step 305 selector control lead 161 switches the selector 163 output 165 from the ground signal 159 present on the B input (157) to the latch output bus signal 139 present on the A input (155), thereby injecting the presteering voltage step signal via step voltage output 137. Also in this step, divisor output lead 143 switches divider 133 from the $N_r$ divisor to the $N_t$ divisor. As a result of these actions, the synthesizer switches from the receive LO frequency to the transmit frequency.

The process next goes to wait step 307. The process waits here for a time period approximately 2 times the time constant of the synthesizer's closed loop transfer function. The time delay here allows the phase detector 103 to possibly generate an error signal in the event the step voltage level 137 is not at it's optimum value.

The process next goes step 309 where the slope measure of phase detector output 105 is taken from signal line 151.

The process next goes to decision step 311 where it determines whether the slope measurement of phase detector outut 105 is positive or negative. If the slope is positive, the process goes to step 313, where it increments (steps up) the up/down counter 171. If the slope is negative, the process goes to step 315, where it decrements (steps down) the counter 171.

The process next goes to step 317 where it waits for a request for the synthesizer to go to the receive state. When the synthesizer is ready to go to the receive state, the process goes to step 319.

In step 319 selector control lead 161 switches the selector 163 output 165 from the latch output bus signal 139 present on the A input (155) to the ground signal 159 present on the B input (157), thereby removing the presteering voltage step signal via step voltage output 137. Also in this step, divisor output lead 143 switches divider 133 from the $N_t$ divisior to the $N_r$ divisor. As a result of these actions, the synthesizer switches from the transmit frequency to the receive LO frequency.

The process next goes to step 321, which is a wait step functionally equivalent to that of step 307 (see above).

The process next goes to step 323, which is a slope measurement step functionally equivalent to that of step 309 (see above).

The process next goes to decision step 325 where it determines whether the slope measurement of phase detector output 105 is positive or negative. If the slope is positive, the process goes to step 327, where it decrements the up/down counter 171. If the slope is negative, the process goes to step 329, where it increments the counter 171.

The process next goes to step 331. This step 331 latches the up/down counter output 177 onto bus 139. The process now returns (step 333) to step 301.

Those skilled in the art will appreciate that logic unit 153 may be implemented, for example, by a suitably-programmed microprocessor together with necessary logic circuitry and units. Also, it will be apparent to those skilled in the art that the up/down counter 171 may be incremented and/or decremented by any convenient predetermined value such as, for instance, by the value 1.

As mentioned above, a significant problem in radio manufacturing today is the effort required to calibrate the transmitter deviation. Manual techniques are especially undesirable here since they both reduce reliability and increase cost.

The present invention is particularly beneficial in this area since it allows the transmitter deviation to be adjusted and maintained automatically, thereby eliminating manual alignment during production, while adding only a small amount of extra circuitry. In fact, the over-all cost of such units might even be reduced somewhat since the automatic adjustment feature allows components with more coarse and/or less precise tolerances to be used in production. Moreover, as discussed above, the invention also helps to guarantee that the alignment will re-adjust itself to the optimum value during the lifetime of the finished unit, by automatically compensating for the effects of heat and aging. As a result, the unit's over-all reliability and useful life-span have also been signficantly increased.

Still another benefit of the present invention is it also corrects for variations in deviation that might be caused by channel changes due to VCO gain changes for varying and differing channels.

Another benefit of the invention, of course, is that it enables a radio transceiver using such a synthesizer to switch from a transmit to a receive state in the minimum time. This quick switching—or "turnaround"—time from transmit to receive could be very beneficial, for example, in a data application where a host computer is polling a large number of data terminals in a round-robin pattern via a common radio link. The switching time of each radio-terminal would be critical here since each terminal must normally reside in the receive mode to determine when it is being polled—or "addressed"—by the host. Once a terminal is polled, it must then switch to the transmit mode before it can transmit it's data to the host. As a result, the time required for the host to poll all the terminals on the radio link will be limited by the mathematical sum of the individual switching times for all the terminals. Thus, for a large number of terminals, even a relatively small decrease in the transceiver switching time of each radio could result in a substantial increase in efficiency and data through-put for the host computer.

While various embodiments of a fast-switching frequency synthesizer, according to the present invention, have been described hereinabove, the scope of the invention is defined by the following claims.

What is claimed is:

1. In a frequency synthesizer with a voltage controlled oscillator (VCO) having a voltage control line and an output, a phase detector having a reference, an input and an output, and a frequency divider having an input and an output, said VCO output coupled to said frequency divider input, said frequency divider output coupled to the phase detector input, a method for switching said frequency synthesizer from a first frequency to a second frequency, comprising the steps of:
   (a) switching said frequency divider from a first value to a second value;
   (b) injecting a predetermined voltage level to the voltage control line of said voltage controlled oscillator at a time essentially fixed with respect to (a);
   (c) after (b), waiting at least a predetermined period of time;
   (d) measuring the slope of the output of said phase detector.

2. The method of claim 1 including the step of:
   (e) determining when said slope is positive.

3. The method of claim 2 including the step of:
   (f) responsive to (e), increasing said voltage level by a predetermined amount.

4. The method of claim 1 including the step of:
   (e) determining when said slope is negative.

5. The method of claim 4 including the step of:
   (f) responsive to (e), decreasing said voltage level by a predetermined amount.

6. In a frequency synthesizer with a voltage controlled oscillator (VCO) having a voltage control line and an output, a phase detector having a reference, an input and an output, and a frequency divider having an input and an output, said VCO output coupled to said frequency divider input, said frequency divider output coupled to the phase detector input, a method for switching said frequency synthesizer from a second frequency to a first frequency, comprising the steps of:
   (a) switching said frequency divider from a second value to a first value;
   (b) removing a predetermined voltage level from the voltage control line of said voltage controlled oscillator at a time essentially fixed with respect to (a);
   (c) after (b), waiting at least a predetermined period of time;
   (d) measuring the slope of the output of said phase detector.

7. The method of claim 6 including the step of:
   (e) determining when said slope is positive.

8. The method of claim 7 including the step of:
   (f) responsive to (e), decreasing said voltage level by a predetermined amount.

9. The method of claim 6 including the step of:
   (e) determining when said slope is negative.

10. The method of claim 9 including the step of:
    (f) responsive to (e), increasing said voltage level by a predetermined amount.

11. In a frequency synthesizer with a counter, a voltage controlled oscillator (VCO) having a voltage control line and an output, a phase detector having a reference, an input and an output, and a frequency divider having an input and an output, said VCO output coupled to said frequency divider input, said frequency divider output coupled to the phase detector input, a method for switching said frequency synthesizer between a first frequency and a second frequency, comprising the steps of:
    to switch said second frequency;
    (a) switching said frequency divider from a first value to a second value;
    (b) injecting a predetermined voltage level to the voltage control line of said voltage controlled oscillator at a time essentially fixed with respect to (a);
    (c) after (b), waiting at least a predetermined period of time;
    (d) measuring the slope of the output of said phase detector.

12. The method of claim 11 including the step of:
    (e) determining when said slope is positive.

13. The method of claim 12 including the step of:
(f) responsive to (e), increasing said counter by a predetermined amount.

14. The method of claim 11 including the step of:
(e) determining when said slope is negative.

15. The method of claim 14 including the step of:
(f) responsive to (e), decreasing said counter by a predetermined amount.

16. The method of claim 15 including the steps of: to switch to said first frequency:
(a) switching said frequency divider from said second value to said first value; and,
(b) removing said predetermined voltage level from the voltage control line of said voltage controlled oscillator at a timne essentially fixed with respect to (a).

17. The method of claim 16 including the step of:
(c) after (b), waiting at least a predetermined period of time.

18. The method of claim 17 including the step of:
(d) measuring the slope of the output of said phase detector.

19. The method of claim 18 including the step of:
(e) determining when said slope is positive.

20. The method of claim 19 including the step of:
(f) responsive to (e), decreasing said counter by a predetermined amount.

21. The method of claim 18 including the step of:
(e) determining when said slope is negative.

22. The method of claim 21 including the step of:
(f) responsive to (e), increasing said counter by a predetermined amount.

23. The method of claim 22 including the step of:
(g) adjusting said predetermined voltage level responsive to said counter.

24. In a frequency synthesizer with a baseband modulator input, a voltage controlled oscillator (VCO) having a voltage control line and an output, a phase detector having a reference, an input and an output, and a frequency divider having an input and an output, said VCO output coupled to said frequency divider input, said frequency divider output coupled to the phase detector input, said baseband modulator input coupled to said VCO voltage control line, a method for switching said frequency synthesizer from a first frequency to a second frequency, comprising the steps of:
(a) switching said frequency divider from a first value to a second value;
(b) injecting a predetermined voltage level to the voltage control line of said voltage controlled oscillator, and,
(c) adjusting the level of said baseband modulator input responsive to said predetermined voltage level.

25. The method of claim 24 where said injecting step (b) occurs at a time generally fixed with respect to switching step (a).

26. The method of claim 25 where said predetermined voltage level is determined to be the optimum level for switching the synthesizer between said first and second frequencies in the minimum time.

27. The method of claim 26 where said predetermined voltage level is responsive to the output of said phase detector.

28. The method of claim 27 where said predetermined voltage level is adjusted so the output of said phase detector is essentially constant.

29. The method of claim 28 where said predetermined voltage level is adjusted so the slope of said phase detector output is minimized.

30. The method of claim 29 where said predetermined voltage level is adjusted so the slope of said phase detector output is generally zero.

31. The method of claim 30 where said predetermined voltage level is adjusted so the slope of said phase detector output is essentially zero at a predetermined time after said synthesizer has been switched to a new frequency.

32. The method of claim 31 where said predetermined voltage level is readjusted periodically responsive to the freqeuncy synthesizer's switching to a new frequency.

33. The method of claim 32 where said predetermined voltage level is changed by a predetermined value.

34. In a frequency synthesizer with a baseband modulator input, a voltage controlled oscillator (VCO) having a voltage control line and an output, a phase detector having a reference, an input and an output, and a frequency divider having an input and an output, said VCO output coupled to said frequency divider input, said frequency divider output coupled to the phase detector input, said baseband modulator input coupled to said VCO voltage control line, a method for switching said frequency synthesizer from a first frequency to a second frequency, comprising the steps of:
(a) switching said frequency divider from a first value to a second value;
(b) injecting a predetermined voltage level to the voltage control line of said voltage controlled oscillator at a time essentially fixed with respect to (a), and
(c) adjusting the level of said baseband modulator input responsive to said predetermined voltage level.

35. The method of claim 34 including the step of:
(d) after (c), waiting at least a predetermined period of time.

36. The method of claim 35 including the step of:
(e) measuring the slope of the output of said phase detector.

37. The method of claim 36 including the step of:
(f) determining when said slope is positive.

38. The method of claim 37 including the step of:
(g) responsive to (f), increasing said voltage level by a predetermined amount.

39. The method of claim 36 including the step of:
(f) determining when said slope is negative.

40. The method of claim 39 including the step of:
(g) responsive to (f), decreasing said voltage level by a predetermined amount.

41. In a frequency synthesizer with a baseband modulator input, a voltage controlled oscillator (VCO) having a voltage control line and an output, a phase detector having a reference, an input and an output, and a frequency divider having an input and an output, said VCO output coupled to said frequency divider input, said frequency divider output coupled to the phase detector input, said baseband modulator input coupled to said VCO voltage control line, a method for switching said frequency synthesizer from a second frequency to a first frequency, comprising the steps of:
(a) switching said frequency divider from a second value to a first value;
(b) removing a predetermined voltage level from the voltage control line of said voltage controlled oscillator at a time essentially fixed with respect to (a), and, (c) adjusting the level of said baseband modulator input responsive to said predetermined voltage level.

42. The method of claim 41 including the step of:
(d) after (c), waiting at least a predetermined period of time.

43. The method of claim 42 including the step of:
(e) measuring the slope of the output of said phase detector.

44. The method of claim 43 including the step of:
(f) determining when said slope is positive.

45. The method of claim 44 including the step of:
(g) responsive to (f), decreasing said voltage level by a predetermined amount.

46. The method of claim 43 including the step of:
(f) determining when said slope is negative.

47. The method of claim 46 including the step of:
(g) responsive to (f), increasing said voltage level by a predetermined amount.

48. In a frequency synthesizer with a baseband modulator input, a counter, a voltage controlled oscillator (VCO) having a voltage control line and an output, a phase detector having a reference, an input and an output, and a frequency divider having an input and an output, said VCO output coupled to said frequency divider input, said frequency divider output coupled to the phase detector input, said baseband modulator input coupled to said VCO voltage control line, a method for switching said frequency synthesizer between a first frequency and a second frequency, comprising the steps of:
to switch to said second frequency:
(a) switching said frequency divider from a first value to a second value;
(b) injecting a predetermined voltage level to the voltage control line of said voltage controlled oscillator at a time essentially fixed with respect to (a); and,
(c) adjusting the level of said baseband modulator input responsive to said predetermined voltage level.

49. The method of claim 48 including the step of:
(d) after (c), waiting at least a predetermined period of time.

50. The method of claim 49 including the step of:
(e) measuring the slope of the output of said phase detector.

51. The method of claim 50 including the step of:
(f) determining when said slope is positive.

52. The method of claim 51 including the step of:
(g) responsive to (f), increasing said counter by a predetermined amount.

53. The method of claim 50 including the step of:
(f) determining when said slope is negative.

54. The method of claim 53 including the step of:
(g) responsive to (f), decreasing said counter by a predetermined amount.

55. The method of claim 54 including the steps of:
to switch to said first frequency:
(a) switching said frequency divider from said second value to said first value; and, at a time essentially fixed with respect to (a),
(b) removing said predetermined voltage level from the voltage control line of said voltage controlled oscillator.

56. The method of claim 55 including the step of:

(c) after (b), waiting at least a predetermined period of time.

57. The method of claim 56 including the step of:
(d) measuring the slope of the output of said phase detector.

58. The method of claim 57 including the step of:
(e) determining when said slope is positive.

59. The method of claim 58 including the step of:
(f) responsive to (e), decreasing said counter by a predetermined amount.

60. The method of claim 57 including the step of:
(e) determining when said slope is negative.

61. The method of claim 60 including the step of:
(f) responsive to (e), increasing said counter by a predetermined amount.

62. The method of claim 61 including the step of:
(g) adjusting said predetermined voltage level responsive to said counter.

63. A frequency synthesizer with a baseband modulator input, a voltage controlled oscillator VCO having a voltage control line and an output, a phase detector having a reference, an input and an output, and a frequency divider having an input and an output, said VCO output coupled to said frequency divider input, said frequency divider output coupled to the phase detector input, said baseband modulator input coupled to said VCO voltage control line, said frequency synthesizer including means for switching from a first frequency to a second frequency, comprising:
means for switching said frequency divider from a first value to a second value;
means for injecting a predetermined voltage level to the voltage control line of said voltage controlled oscillator;
means for adjusting the level of said baseband modulator input responsive to said predetermined voltage level.

64. The synthesizer of claim 63 where said injecting means is arranged for injecting said predetermined voltage level at a time generally fixed with respect to the time of switching.

65. The synthesizer of claim 64 including means for adjusting said predetermined voltage level to the optimum level for switching the synthesizer between said first and second frequencies in the minimum time.

66. The synthesizer of claim 65 where said predetermined voltage level is adjusted responsive to the output of said phase detector.

67. The synthesizer of claim 66 where said predetermined voltage level is adjusted so the output of said phase detector is essentially constant.

68. The synthesizer of claim 67 where said predetermined voltage level is adjusted so the slope of said phase detector output is minimized.

69. The synthesizer of claim 68 where said predetermined voltage level is adjusted so the slope of said phase detector output is generally zero.

70. The synthesizer of claim 69 where said predetermined voltage level is adjusted so the slope of said phase detector output is essentially zero at a predetermined time after said synthesizer has been switched to a new frequency.

71. The synthesizer of claim 70 where said predetermined voltage level is re-adjusted periodically responsive to the frequency synthesizer's switching to a new frequency.

72. The synthesizer of claim 71 where said predetermined voltage level is changed by a predetermined value.

73. In a frequency synthesizer with a baseband modulator input, a voltage controlled oscillator (VCO) having a voltage control line and an output, said baseband modulator input coupled to said VCO voltage control line, and a phase detector, said frequency synthesizer including means for switching from a first frequency to a second frequency, the improvement comprising:
arranging said frequency synthesizer for injecting a predetermined voltage level to the voltage control line of said voltage controlled oscillator at a time related to switching the synthesizer to a new frequency, and,
arranging said frequency synthesizer for adjusting the level of said baseband modulator input responsive to said predetermined voltage level.

74. The synthesizer of claim 73, further comprising adjusting the predetermined voltage level to a value optimum to switch the synthesizer to said second frequency in the minimum time.

75. The synthesizer of claim 74 wherein said predetermined voltage level is adjusted responsive to the output of said phase detector.

76. The synthesizer of claim 75 wherein said predetermined voltage level is adjusted to maintain said phase detector output to be as nearly constant as possible.

77. The synthesizer of claim 76 wherein said predetermined voltage level is adjusted to maintain the slope of said phase detector output to be as nearly equal to zero as possible.

78. The synthesizer of claim 77 wherein said predetermined voltage level is re-adjusted periodically responsive to the frequency synthesizer's switching from one frequency to the other.

79. The method of claim 20 including the step of:
(g) adjusting said predetermined voltage level responsive to said counter.

80. The method of claim 13 including the steps of:
to switch to said frequency:
(a) switching said frequency divider from said second value to said first value; and,
(b) removing said predetermined voltage level from the voltage control line of said voltage controlled oscillator at a time essentially fixed with respect to (a).

81. The method of claim 80 including the step of:
(c) after (b), waiting at least a predetermined period of time.

82. The method of claim 81 including the step of:
(d) measuring the slope of the output of said phase detector.

83. The method of claim 82 including the step of:
(e) determining when said slope is positive.

84. The method of claim 83 including the step of:
(f) responsive to (e), decreasing said counter by a predetermined amount.

85. The method of claim 82 including the step of:
(e) determining when said slope is negative.

86. The method of claim 85 including the step of:
(f) responsive to (e), increasing said counter by a predetermined amount.

87. The method of claim 86 including the step of:
(g) adjusting said predetermined voltage level responsive to said counter.

88. The method of claim 84 including the step of:
(g) adjusting said predetermined voltage level responsive to said counter.

89. The method of claim 59 including the step of:
(g) adjusting said predetermined voltage level responsive to said counter.

90. The method of claim 52 including the steps of:
to switch to said first frequency:
(a) switching said frequency divider from said second value to said first value; and, at a time essentially fixed with respect to (a),
(b) removing said predetermined voltage level from the voltage control line of said voltage controlled oscillator.

91. The method of claim 90 including the step of:
(c) after (b), waiting at least a predetermined period of time.

92. The method of claim 91 including the step of:
(d) measuring the slope of the output of said phase detector.

93. The method of claim 92 including the step of:
(e) determining when said slope is positive.

94. The method of claim 93 including the step of:
(f) responsive to (e), decreasing said counter by a predetermined amount.

95. The method of claim 92 including the step of:
(e) determining when said slope is negative.

96. The method of claim 95 including the step of:
(f) responsive to (e), increasing said counter by a predetermined amount.

97. The method of claim 96 including the step of:
(g) adjusting said predetermined voltage level responsive to said counter.

98. The method of claim 94 including the step of:
(g) adjusting said predetermined voltage level responsive to said counter.

* * * * *